United States Patent
An et al.

(10) Patent No.: US 11,328,761 B2
(45) Date of Patent: May 10, 2022

(54) MEMORY DEVICE AND METHOD OF OPERATING THE MEMORY DEVICE

(71) Applicant: SK hynix Inc., Icheon-si (KR)

(72) Inventors: Chi Wook An, Icheon-si (KR); Kyung Sub Park, Icheon-si (KR); Un Sang Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/076,504

(22) Filed: Oct. 21, 2020

(65) Prior Publication Data
US 2021/0398583 A1 Dec. 23, 2021

(30) Foreign Application Priority Data

Jun. 23, 2020 (KR) .......................... 10-2020-0076692

(51) Int. Cl.
| | |
|---|---|
| *G11C 16/06* | (2006.01) |
| *G11C 11/4072* | (2006.01) |
| *G11C 11/408* | (2006.01) |
| *G11C 5/06* | (2006.01) |
| *G11C 11/4074* | (2006.01) |
| *G11C 11/409* | (2006.01) |
| *G11C 16/34* | (2006.01) |

(52) U.S. Cl.
CPC ............ *G11C 11/4072* (2013.01); *G11C 5/06* (2013.01); *G11C 11/409* (2013.01); *G11C 11/4074* (2013.01); *G11C 11/4085* (2013.01); *G11C 11/4087* (2013.01); *G11C 16/34* (2013.01); *G11C 16/3436* (2013.01)

(58) Field of Classification Search
CPC ... G11C 5/06; G11C 11/4072; G11C 11/4074; G11C 11/4085; G11C 11/4087; G11C 11/409; G11C 16/34; G11C 16/3436
USPC .......................... 365/185.13, 185.22, 185.28
See application file for complete search history.

(56) References Cited

U.S. PATENT DOCUMENTS

| | | | |
|---|---|---|---|
| 9,001,586 B1 * | 4/2015 | Yoo ..................... | G11C 16/0483 365/185.17 |
| 11,056,176 B2 * | 7/2021 | Shin ..................... | G11C 11/4087 |

FOREIGN PATENT DOCUMENTS

| | | |
|---|---|---|
| KR | 1020170086932 A | 7/2017 |
| KR | 1020180073885 A | 7/2018 |
| KR | 1020180080003 A | 7/2018 |
| KR | 1020190105326 A | 9/2019 |

* cited by examiner

*Primary Examiner* — Son L Mai
(74) *Attorney, Agent, or Firm* — William Park & Associates Ltd.

(57) ABSTRACT

The memory device includes a memory block, a voltage generator, a pass switch group connecting or blocking the global lines and the local lines to each other or from each other in response to a block selection voltage, a decoder, and a logic circuit configured to control the decoder and the voltage generator so that the local lines are floated after initializing a channel of the strings and a voltage of the global lines is lower than a voltage of the global lines when initializing the channel of the strings, when a program operation of selected memory cells included in a selected page of the memory block is completed, the channels of the strings are initialized and the local lines are floated.

20 Claims, 14 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0076692, filed on Jun. 23, 2020, in the Korean Intellectual Property Office, the entire disclosure of which is incorporated herein by reference.

BACKGROUND

1. Technical Field

The present disclosure relates to a memory device and a method of operating the memory device, and more particularly, to a memory device capable of performing a program operation and a method of operating the program operation.

2. Related Art

A memory device may store data or output the stored data. For example, the memory device may be a volatile memory device in which stored data is lost when power supply is cut off, or may be a non-volatile memory device in which stored data is maintained even though the power supply is cut off. The memory device may include a memory cell array in which data is stored, peripheral circuits capable of performing a program, read or erase operation, and a logic circuit capable of controlling the peripheral circuits.

The memory cell array may include a plurality of memory blocks, and each of the plurality of memory blocks may include a plurality of memory cells. The memory cells may be connected in series with each other between a bit line and a source line and configure a string. Memory cells included in different strings and connected to the same word line may configure a page. The program operation and the read operation may be performed in a page unit. The program operation may include a sub program operation of increasing a threshold voltage of selected memory cells and a verify operation of determining whether the threshold voltage of the selected memory cells increases to a target voltage. The sub program operation and the verify operation may configure one loop, and a plurality of loops may be performed in the program operation. When the plurality of loops are performed, a program voltage may be increased stepwise. Such a program method is referred to as an incremental step pulse program (ISPP) method.

SUMMARY

A memory device according to an embodiment of the present disclosure may include a memory block including a plurality of strings including a plurality of memory cells connected to local lines, a voltage generator configured to generate operation voltages and output the operation voltages to global lines, a pass switch group connecting or blocking the global lines and the local lines to each other or from each other in response to a block selection voltage, a decoder configured to output the block selection voltage in response to a row address, and a logic circuit configured to control the decoder and the voltage generator so that the local lines are floated after initializing a channel of the strings and a voltage of the global lines is lower than a voltage of the global lines when initializing the channel of the strings, when a program operation of selected memory cells included in a selected page of the memory block is completed, the channels of the strings are initialized and the local lines are floated.

A method of operating a memory device according to an embodiment of the present disclosure may include providing a voltage generator outputting operation voltages through global lines, pass switches transferring the operation voltages applied to the global lines to local lines, and a memory block including a plurality of memory cells connected to the local lines, connecting the global lines and the local lines to each other, performing a program operation of selected memory cells connected to a selected word line among the local lines, initializing channels of strings including the memory cells when the program operation is completed, floating the channels when the channels are initialized, blocking the global lines and the local lines from each other when the channels are floated, and decreasing a voltage of the global word lines included in the global lines when the local lines are floated.

DETAILED DESCRIPTION

An embodiment of the present disclosure may provide a memory device and a method of operating the same capable of suppressing error occurrence during a program operation.

The present technology may improve reliability of a read operation of a programmed memory block by suppressing error occurrence during a program operation.

Figure 1:
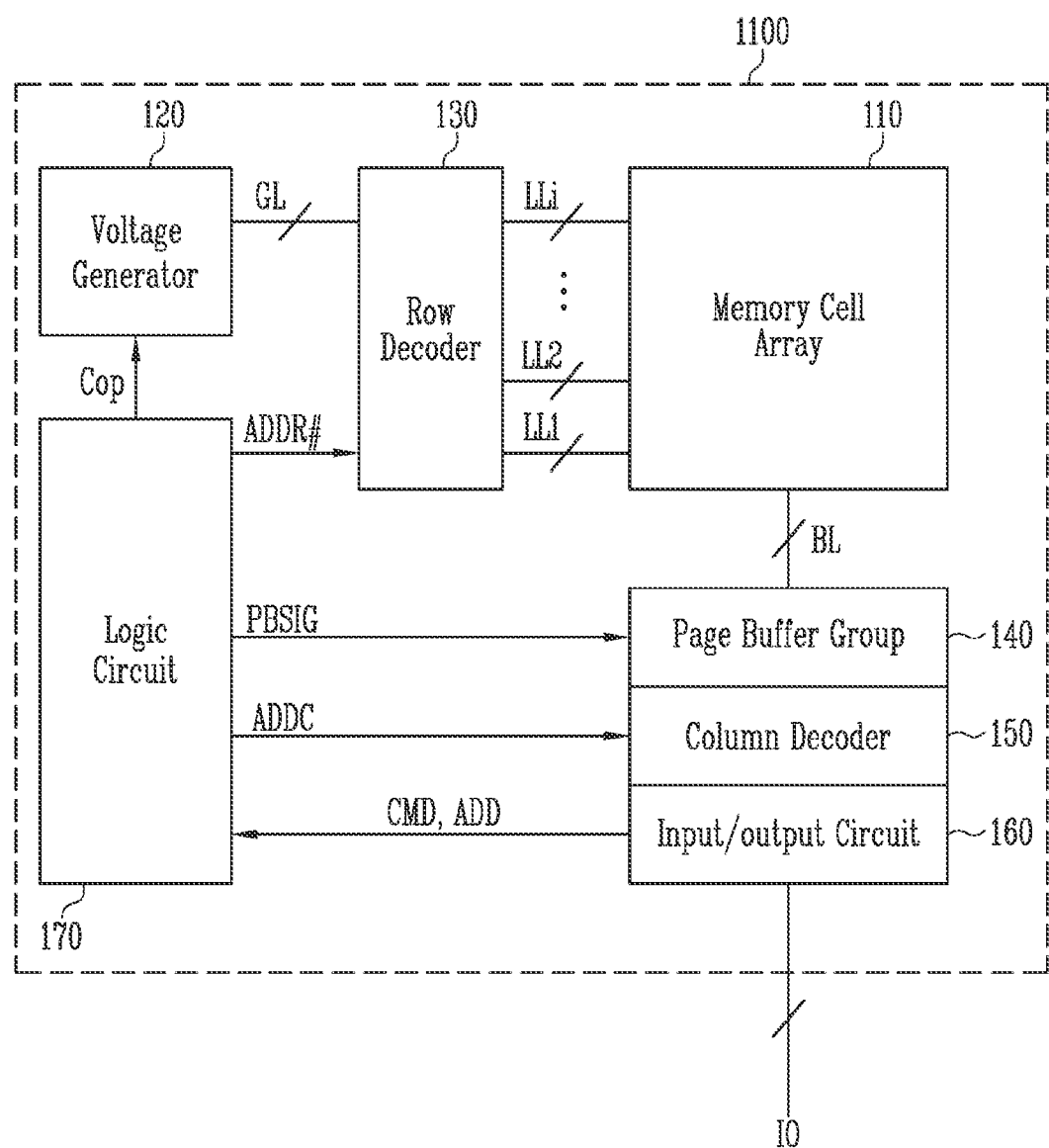
FIG. 1 is a diagram for describing a memory device according to an embodiment of the present disclosure.

FIG. 1 is a diagram for describing a memory device according to an embodiment of the present disclosure.

Referring to FIG. 1, the memory device 1100 may include a memory cell array 110 in which data is stored, peripheral circuits 120 to 160 that perform program, read, and erase operations, and a logic circuit 170 that controls the peripheral circuits. The peripheral circuits 120 to 160 may include a voltage generator 120, a row decoder 130, a page buffer group 140, a column decoder 150, and an input/output circuit 160.

The memory cell array 110 may include a plurality of memory blocks, and each of the memory blocks may include a plurality of memory cells. The memory blocks may be connected to the row decoder 130 through first to i-th local lines LL1 to LLi, and may be connected to the page buffer group 140 through bit lines BL. In an embodiment, i may be an integer greater than one.

The voltage generator 120 may generate operation voltages required for the program, read, or erase operation in response to an operation code Cop. For example, the voltage generator 120 may generate operation voltages including a program voltage, a read voltage, an erase voltage, a pass voltage, a turn-off voltage, and the like, and adjust an output time of the operation voltages according to a set time. The voltage generator 120 may transfer the operation voltages to the row decoder 130 through global lines GL.

The row decoder 130 may select a memory block in response to a row address ADDR #, and may transfer the operation voltages received through the global lines GL to the local lines (any one of LL1 to LLi) connected to the selected memory block. Each of the first to i-th local lines LL1 to LLi may include a plurality of word lines, drain selection lines, and source selection lines.

During the program operation, the page buffer group 140 may temporarily store data received from the outside, and temporarily store data sensed from the memory cells during a verify or read operation. The page buffer group 140 may temporarily store data or precharge bit lines in response to page buffer signals PBSIG, and sense a voltage or a current of the bit lines.

The column decoder 150 may transmit data between the input/output circuit 160 and the page buffer group 140 in response to a column address ADDC.

The input/output circuit 160 may receive a command CMD and an address ADD from an external device (for example, a controller) through input/output lines IO, and input or output data. During the program operation, the input/output circuit 160 may transfer the command CMD and the address ADD input through the input/output lines IO to the logic circuit 170 and transfer data to the page buffer group 140. During the read operation, the input/output circuit 160 may output data read from the page buffer group 140 to an external device.

The logic circuit 170 may be configured of software and hardware capable of controlling the peripheral circuits in response to the command CMD and the address ADD. The logic circuit 170 may output the operation code Cop, the page buffer signals PBSIGS, the row address ADDR #, and the column address ADDC in response to the command CMD and the address ADD.

Figure 2:
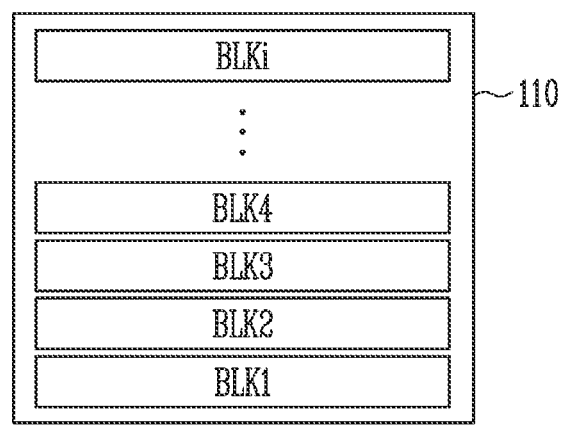
FIG. 2 is a diagram for describing a memory cell array of FIG. 1.

FIG. 2 is a diagram for describing the memory cell array of FIG. 1.

Referring to FIG. 2, the memory cell array 110 may include first to i-th memory blocks BLK1 to BLKi. In a single plane structure, the first to i-th memory blocks BLK1 to BLKi may configure the memory cell array 110. In a multi-plane structure, the first to i-th memory blocks BLK1 to BLKi may configure one plane, and the memory cell array 110 may include a plurality of planes. The first to i-th memory blocks BLK1 to BLKi may be configured to be identical to each other, and among the first to i-th memory blocks BLK1 to BLKi, the i-th memory block BLKi is specifically described as an embodiment as follows.

Figure 3:
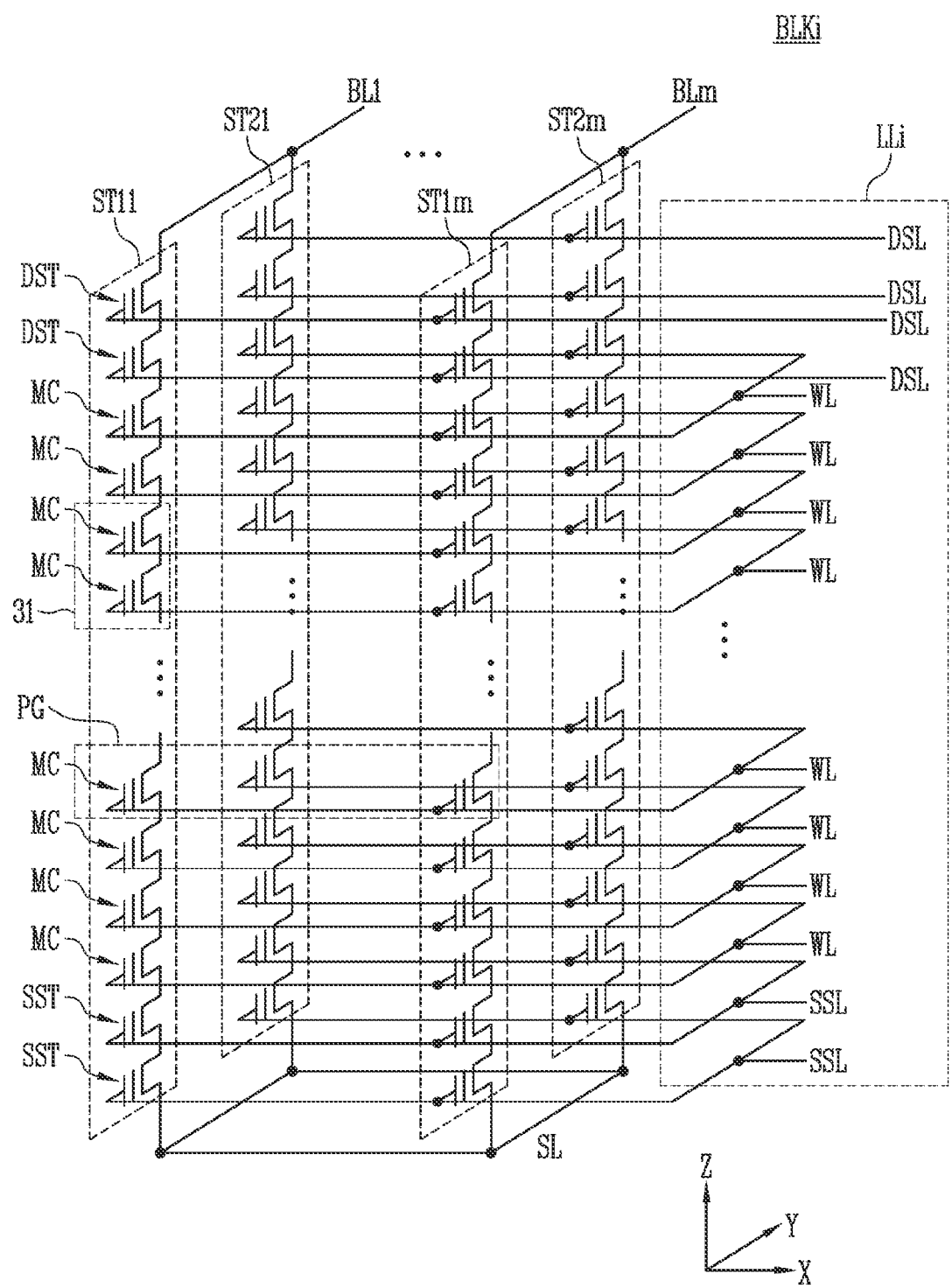
FIG. 3 is a diagram for specifically describing an i-th memory block according to an embodiment of the present disclosure.

FIG. 3 is a diagram for specifically describing the i-th memory block according to an embodiment of the present disclosure.

Referring to FIG. 3, the i-th memory block BLKi may include a plurality of memory strings ST11 to ST1$m$ and ST21 to ST2$m$ connected between the bit lines BL1 to BLm and a source line SL. Each of the memory strings ST11 to ST1$m$ and ST21 to ST2$m$ may extend along a Z direction. Here, the Z direction may be a direction in which memory cells MC are stacked, and may be a direction perpendicular to a substrate. m is an integer equal to or greater than 2.

Each of the memory strings ST11 to ST1$m$ and ST21 to ST2$m$ may include source selection transistors SST, the memory cells MC, and drain selection transistors DST connected in series.

The source selection transistors SST included in one of the memory strings (any one of ST11 to ST1$m$ and ST21 to ST2$m$) may be connected in series between the memory cells MC and the source line SL. Gate electrodes of the source selection transistors SST may be connected to the source selection lines SSL. In addition, the source selection transistors SST positioned on the same layer may be connected to the same source selection line SSL.

The memory cells MC included in one of the memory strings (any one of ST11 to ST1$m$ and ST21 to ST2$m$) may be connected in series between at least one source selection transistor SST and at least one drain selection transistor DST. Gate electrodes of the memory cells MC may be connected to word lines WL. The operation voltages (the program voltage, the pass voltage, the read voltage, and the like) required for driving may be applied to each of the word lines WL. A group of memory cells connected to the same word line WL becomes a page PG. The memory cells MC may be programmed or read in a unit of the page PG.

The drain selection transistors DST included in one of the memory strings (any one of ST11 to ST1$m$ and ST21 to ST2$m$) may be connected in series between the bit lines BL1 to BLm and the memory cells MC. Gate electrodes of the drain selection transistors DST are connected to the drain selection line DSL. The drain selection transistors DST formed on the same layer among the drain selection transistors DST included in the memory strings ST11 to ST1$m$ or ST21 to ST2$m$ arranged in the same row (X direction) may be connected to the same drain selection line DSL. In addition, the drain selection transistors DST arranged in different rows (X direction) may be connected to different drain selection lines DSL.

The source selection lines SSL, the word lines WL, and the drain selection lines DSL connected to the i-th memory block BLKi may be included in the i-th local lines LLi.

A structure of some memory cells 31 included in an eleventh string ST11 is specifically described as follows.

Figure 4:
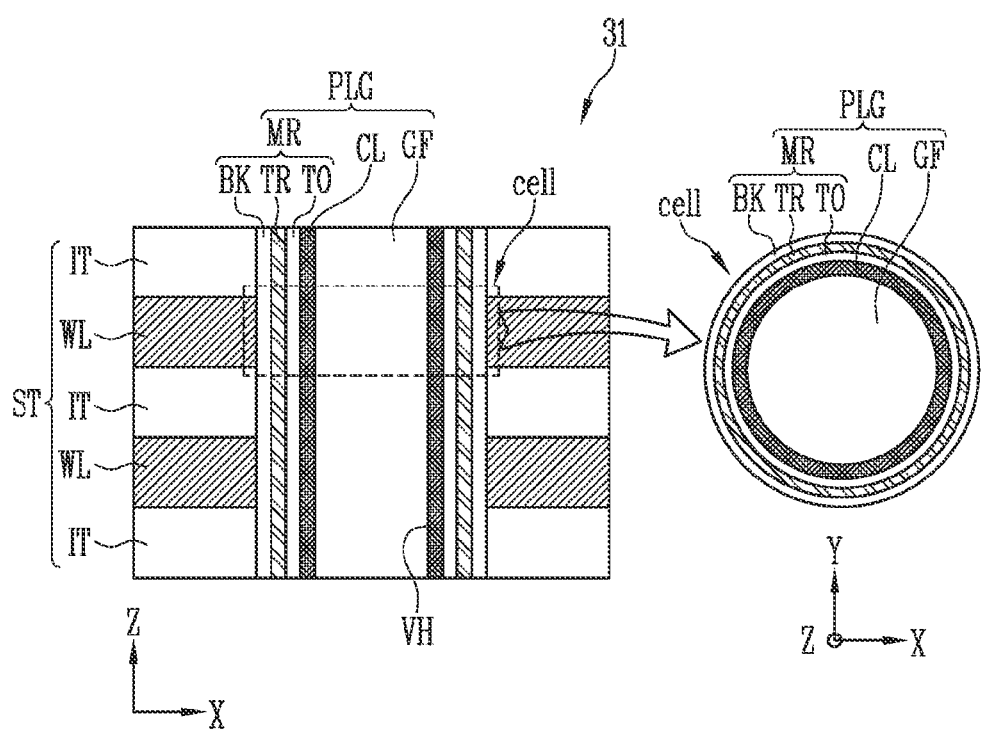
FIG. 4 is a diagram for specifically describing a structure of a memory cell.

FIG. 4 is a diagram for specifically describing the structure of the memory cell.

Referring to FIG. 4, the memory block may be formed in a stack structure including a plurality of word lines WL and interlayer insulating layers IT stacked in the direction Z perpendicular to the substrate, and a plug PLG vertically passing through the word lines WL and the interlayer insulating layers IT. The word lines WL and the interlayer insulating layers IT may be alternately stacked. The word lines WL may be formed of a conductive material, and the interlayer insulating layers IT may be formed of an insulating material.

The plug PLG may be formed in a vertical hole VH vertically passing through the word lines WL and the interlayer insulating layers IT. The plug PLG may include a gap fill layer GF, a channel layer CL, and a memory layer MR. The gap-fill layer GF may be formed in a cylindrical to shape extending in the vertical direction Z from a center of the vertical hole VH. The channel layer CL may be formed in a cylindrical shape surrounding a sidewall of the gap fill layer GF, and the memory layer MR may be formed in a cylindrical shape surrounding a sidewall of the channel layer CL. The gap fill layer GF may be formed of an insulating material, and the channel layer CL may be formed of polysilicon. Alternatively, the channel layer CL may be formed in a cylindrical shape instead of the gap fill layer GF in the center of the vertical hole VH. In the present embodiments described below, the plug PLG in which the gap fill layer GF is formed in the center of the vertical hole VH is described as an example.

The memory layer MR may include a cylindrical tunnel insulating layer TO surrounding a sidewall of the channel layer CL, a cylindrical charge trap layer TR surrounding a sidewall of the tunnel insulating layer TO, and a cylindrical blocking layer BK surrounding a sidewall of the charge trap layer TR. The tunnel insulating layer TO may be formed of an oxide layer, which is an insulating material, the charge trap layer TR may be formed of a nitride layer, and the blocking layer BK may be formed of an oxide layer, which is an insulating material. The tunnel insulating layer TO is a layer in which an electron is tunneled between the channel layer CL and the charge trap layer TR, the charge trap layer TR is a layer that traps the electron, and the blocking layer BK is a layer that blocks the electron trapped in the charge trap layer TR from moving to the word line WL.

The memory cell may be formed in the plug PLG adjacent to the word line WL, and a width of the memory cell may be the same as a width of the plug PLG. For example, since the plug PLG is formed inside the vertical hole VH vertically passing through the word lines WL and the interlayer insulating layers IT, the width of the plug PLG is determined according to a width of the vertical hole VH.

When a positive voltage is applied to the word lines WL, a channel may be formed in the channel layer CL included in the memory cells. For example, when a positive voltage higher than a threshold voltage of the memory cells is applied to the word line WL, the channel may be formed in the channel layer CL included in the memory cell, and thus the memory cell may be turned on. A voltage of the channel layer CL becomes a channel voltage, and the channel voltage may be changed according to the threshold voltage of the memory cells or the voltage applied to the word lines WL.

Figure 5:
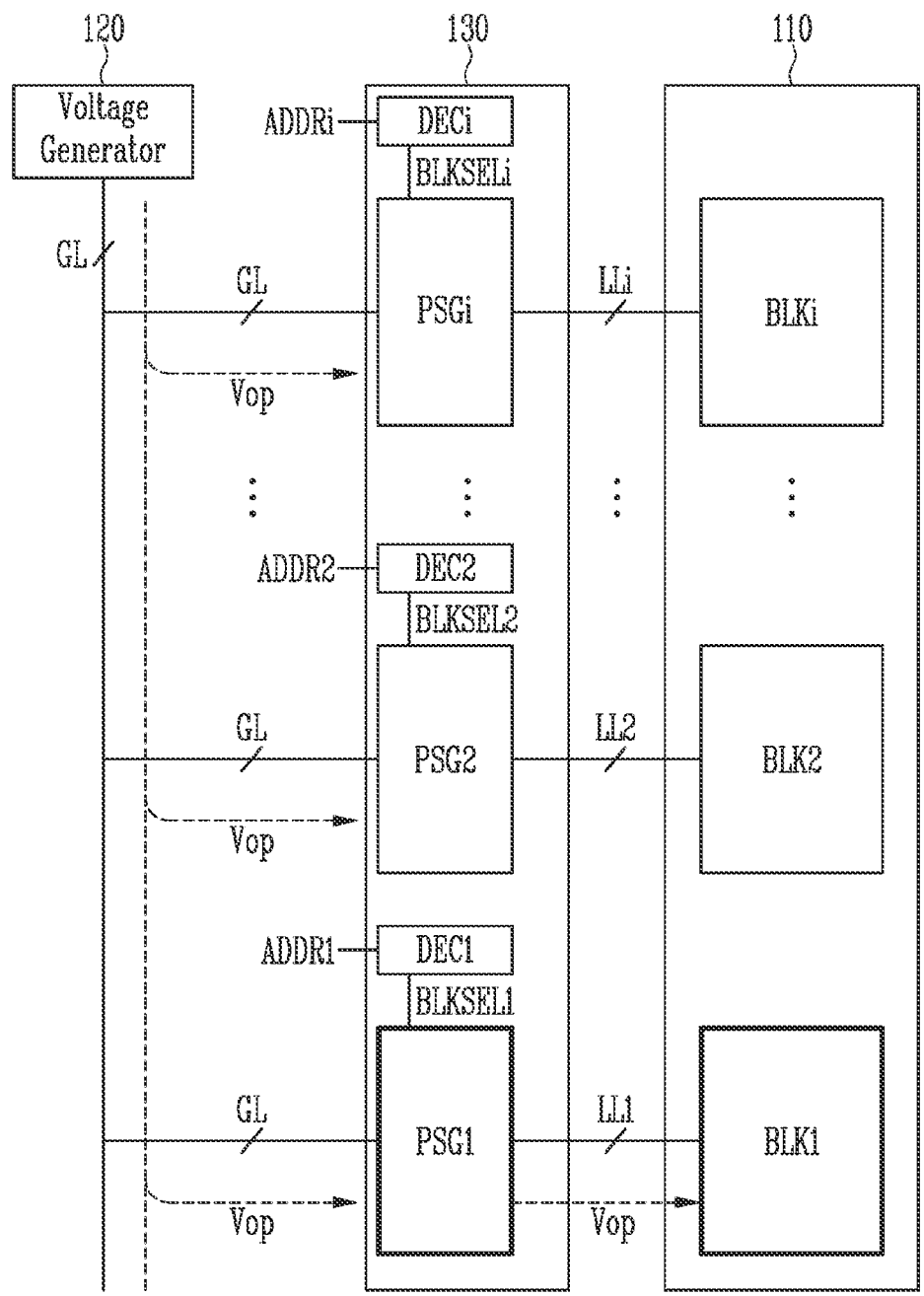
FIG. 5 is a diagram for specifically describing a row decoder according to an embodiment of the present disclosure.

FIG. 5 is a diagram for specifically describing a row decoder according to an embodiment of the present disclosure.

Referring to FIG. 5, the row decoder 130 may include first to i-th pass switch groups PSG1 to PSGi connected to the first to i-th memory blocks BLK1 to BLKi, and first to i-th decoders DEC1 to DECi that selectively activate the first to i-th pass switch groups PSG1 to PSGi. For example, the i-th decoder DECi and the i-th pass switch group PSGi may form one pair, and select or unselect the i-th memory block BLKi according to an i-th row address ADDRi. The first to i-th pass switch groups PSG1 to PSGi may be connected between the global lines GL and the first to i-th local lines LL1 to LLi, respectively. That is, the operation voltages output from the voltage generator 120 may be commonly transferred to the first to i-th pass switch groups PSG1 to PSGi through the global lines GL. The first to i-th pass switch groups PSG1 to PSGi may be connected to the first to i-th decoders DEC1 to DECi through block selection lines BLKSEL1 to BLKSELi.

During the program operation, when the voltage generator 120 outputs the operation voltages Vop used for the program operation to the global lines GL, the operation voltages Vop may be commonly transferred to the first to i-th pass switch groups PSG1 to PSGi. When the first memory block BLK1 is selected, the first decoder DEC1 may output the block selection voltage of the positive voltage to a first block selection line BLKSEL1 in response to a first row address ADDR1. When the block selection voltage is applied through the first block selection line BLKSEL1, the first pass switch group PSG1 may connect the global lines GL and the first local lines LL1 to each other. At this time, since the second to i-th decoders DEC2 to DECi are deactivated according to second to i-th addresses ADDR2 to ADDRi, the second to i-th pass switch groups PSG2 to PSGi block between the global lines GL and the second to i-th local lines LL2 to LLi to each other. Therefore, the second to i-th local lines LL2 to LLi may be floated. Since the operation voltages Vop are applied to the first local lines LL1, the program operation of the first memory block BLK1 may be performed.

When a turn-off voltage is applied through the first block selection line BLKSEL1, the first pass switch group PSG1 may block the global lines GL and the first local lines LL1 to each other.

Figure 6:
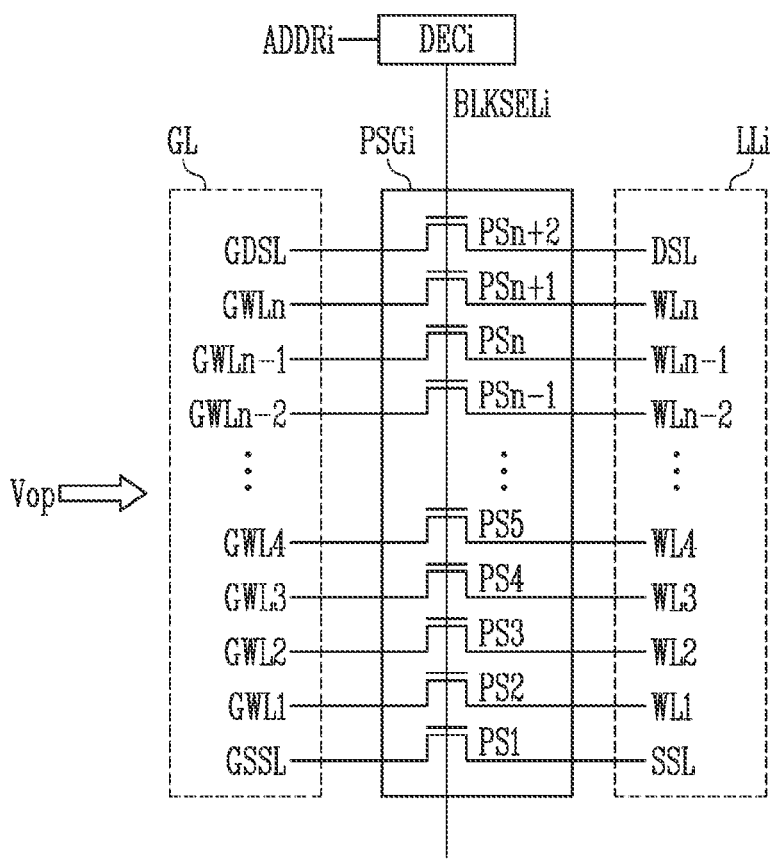
FIG. 6 is a diagram for specifically describing a pass switch group shown in FIG. 5.

FIG. 6 is a diagram for specifically describing the pass switch group shown in FIG. 5.

Referring to FIG. 6, the i-th pass switch group PSGi may include first to (n+2)-th pass switches PS1 to PSn+2. The first to (n+2)-th pass switches PS1 to PSn+2 may be connected between the global lines GL and the i-th local lines LLi, and gates of the first to (n+2)-th pass switches PS1 to PSn+2 may be commonly connected to the i-th block selection line BLKSELi. For example, the first pass switch PS1 may be connected between a global source selection line GSSL and the source selection line SSL, the second to (n+1)-th pass switches PS2 to PSn+1 may be connected between first to n-th global word lines GWL1 to GWLn and first to n-th word lines WL1 to WLn, and the (n+2)-th pass switch PSn+2 may be connected between a global drain selection line GDSL and the drain selection line DSL.

When the block selection voltage of the positive voltage is applied to the i-th block selection line BLKSELi, the first to (n+2)-th pass switches PS1 to PSn+2 may be simultaneously turned on. When all of the first to (n+2)-th pass switches PS1 to PSn+2 are turned on, the global lines GL are connected to the i-th local lines LLi. At this time, the operation voltages Vop applied to the global source selection line GSSL, the first to n-th global word lines GWL1 to GWLn, and the global drain selection line GDSL may be transferred to the source selection line SSL, the first to n-th word lines WL1 to WLn, and the drain selection line DSL.

When the turn-off voltage is applied to the i-th block selection line BLKSELi, the first to (n+2)-th pass switches PS1 to PSn+2 may be simultaneously turned off. When all of the first to (n+2)-th pass switches PS1 to PSn+2 are turned off, the i-th pass switch group PSG1 may block the global lines GL and the i-th local lines LLi to each other. Therefore, the operation voltages Vop are applied to the global source selection line GSSL, the first to n-th global word lines GWL1 to GWLn, and the global drain selection line GDSL, but the source selection line SSL, the first to n-th word lines WL1 to WLn, and the drain selection line DSL may be floated. In an embodiment, when a pass switch is turned off, the operation voltages Vop applied to the global source selection line GSSL, the first to n-th global word lines GWL1 to GWLn, and the global drain selection line GDSL are blocked from being transferred to the source selection line SSL, the first to n-th word lines WL1 to WLn, and the drain selection line DSL.

Figure 7:
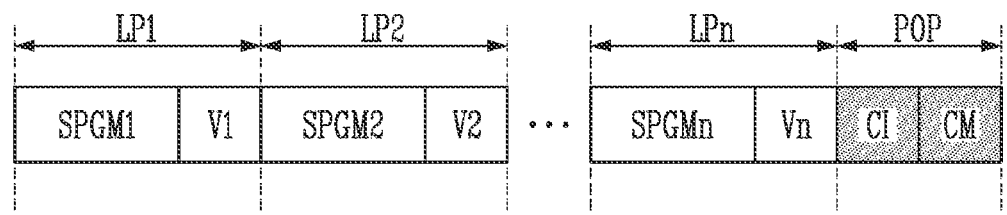
FIGS. 7 and 8 are diagrams for describing an operation method according to a first embodiment of the present disclosure.
Figure 8:
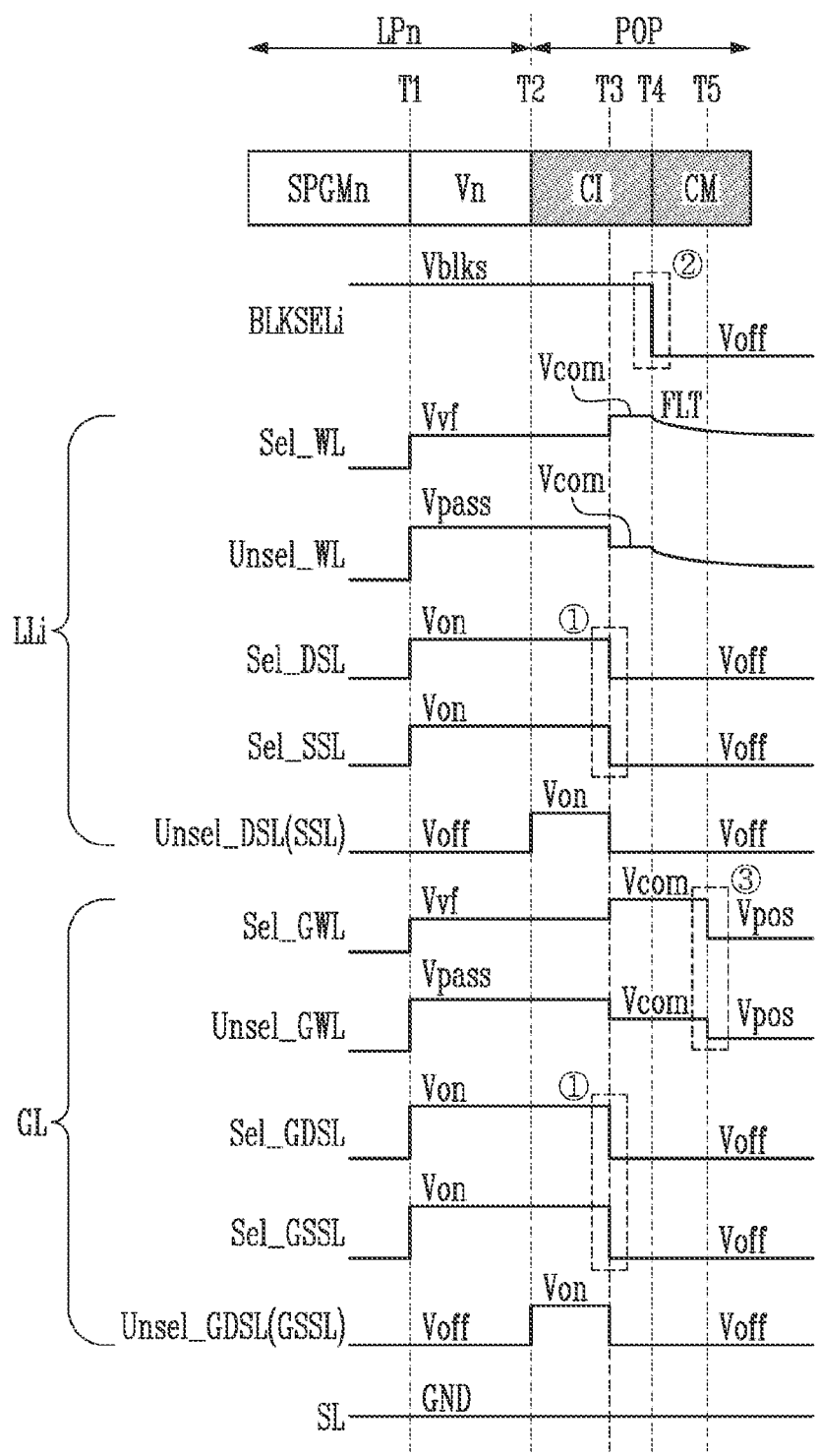

FIGS. 7 and 8 are diagrams for describing an operation method according to a first embodiment of the present disclosure.

FIG. 7 is a diagram for briefly describing a program operation method of an i-th memory block according to the first embodiment, and FIG. 8 is a diagram for specifically describing the program operation method of the i-th memory block according to the first embodiments.

Referring to FIG. 7, the program operation of the selected memory cells may be performed until the threshold voltage of the selected memory cells increase to a target voltage. For example, the program operation may be performed by applying the program voltage to the selected word line connected to the selected memory cells. The program operation may be performed by an incremental step pulse program (ISPP) method of increasing the program voltage applied to the selected word line stepwise. In the program operation of the ISPP method, first to n-th loops LP1 to LPn (n is a positive integer) may be performed. Each of the first to n-th loops LP1 to LPn may include a sub program operation of increasing the threshold voltage of the memory cells using the program voltage and a verify operation of determining whether the threshold voltage of the memory cells is increased to the target voltage. For example, in the first loop LP1, a first sub program operation SPGM1 using a first program voltage may be performed, and a first verify operation V1 may be performed after the first sub program operation SPGM1 is performed. When the threshold voltages of the selected memory cells reach the target voltage, the first verify operation V1 is passed, and the program operation of the selected memory cells may be ended. When it is detected that the threshold voltage of at least one of the selected memory cells does not reach the target voltage, the first verify operation V1 may be determined as a failure, and the second loop LP2 may be performed. In the second loop LP2, a second sub program operation SPGM2 using a program voltage higher than the program voltage used in the first sub program operation SPGM1 may be performed, and a second verify operation V2 for determining whether the threshold voltage of the memory cells on which the second sub program operation SPGM2 is performed is increased to the target voltage may be performed. In such a method, the first to n-th loops LP1 to LPn may be performed until the threshold voltage of the selected memory cells are increased to the target voltage. That is, the n-th loop LPn may include an n-th sub program operation SPGMn and an n-th verify operation Vn, and when the n-th verify operation Vn is passed, the program operation of the selected memory cells may be ended.

When the program operation of the selected memory cells included in the selected page is completed, a post operation POP may be continuously performed for the next operation for the selected page.

For example, in the post operation POP of the first embodiments, a channel initialization operation CI and a channel maintenance operation CM may be performed. The channel initialization operation CI and the channel maintenance operation CM may be performed to prevent a phenomenon in which a voltage of the channels is lower than a reference level due to coupling according to a voltage drop of the word lines when the word lines to which the positive voltage is applied are discharged in the program operation. Here, the reference level may be 0V. The post operation POP according to a first embodiment is specifically described as follows.

Referring to FIG. 8, in a period T1 to T2, an n-th verify operation Vn of the n-th loop LPn may be performed. When the n-th verify operation Vn is passed, the post operation POP may be performed from the time point T2.

While the program operation is performed, a block selection voltage Vblks having a positive voltage may be applied to the i-th block selection line BLKSELi. Therefore, voltages applied to the global lines GL may be transferred to the i-th local lines LLi. For example, at the time point T1, when a verify voltage Vvf is applied to a global selected word line Sel_GWL, the verify voltage Vvf may be transferred to a selected word line Sel_WL, and when a pass voltage Vpass is applied to a global unselected word lines Unsel_GWL, the pass voltage Vpass may be transferred to unselected word lines Unsel_WL. When a turn-on voltage Von is applied to a selected global drain selection line Sel_GDSL and a selected global source selection line Sel_GSSL, the turn-on voltage Von may be transferred to a selected drain selection line Sel_DSL and a selected source selection line Sel_SSL.

A the turn-off voltage Voff may be applied to unselected global drain and source selection lines Unsel_GDSL and Unsel_GSSL, and thus, the turn-off voltage Voff may also be applied to unselected drain and source selection lines Unsel_DSL and Unsel_SSL. A ground voltage GND may be applied to the source line SL.

At the time point T2, when the n-th verify operation Vn is passed, since the program operation of the selected page is completed, the post operation POP may be performed from the time point T2. In a first embodiment shown in FIG. 8, the post operation POP may include the channel initialization operation CI and the channel maintenance operation CM. The channel initialization operation CI may be performed in a period T2 to T4. The channel initialization operation CI may include applying the turn-on voltage Von to the global selection lines Sel_GDSL, Sel_GSSL, Unsel_GDSL, and Unsel_GSSL (T2 to T3), applying the turn-off voltage Voff to the selection lines Sel_GDSL, Sel_GSSL, Unsel_GDSL, and Unsel_GSSL (①), floating the local lines (②), and discharging the global word lines (③). Steps ①, ② and ③ may be sequentially performed.

The channel initialization operation CI is specifically described as follows.

At the time point T2, the turn-on voltage Von may be applied to the unselected global drain and source selection lines Unsel_GDSL and Unsel_GSSL. That is, in a period T2 to T3, since the turn-on voltage Von is applied to the unselected global drain and source selection lines Unsel_GDSL and Unsel_GSSL and the selected global drain and source selection lines Sel_GDSL and Sel_GSSL, the turn-on voltage Von may also be transferred to the unselected drain and source selection lines Unsel_DSL and Unsel_SSL and the selected drain and source selection lines Sel_DSL and Sel_SSL. Accordingly, channels of all strings included in the i-th memory block BLKi may be initialized.

At the time point T3, the turn-off voltage Voff may be applied to the selected global drain and source selection lines Sel_GDSL and Sel_GSSL and the unselected global drain and source selection lines Unsel_GDSL and Sel_GSSL (①). In addition, at the time point T3, a compensation voltage Vcom having a positive voltage level may be applied to the global word lines Sel_GWL and Unsel_GWL. The compensation voltage Vcom may have a level higher than the verify voltage Vvf and lower than the pass voltage Vpass. Since the block selection voltage Vblks is applied to the i-th block selection line BLKSELi in a period T3 to T4, the turn-off voltage Voff may be transferred to the selected drain and source selection lines Sel_DSL and Sel_SSL included in the i-th local lines W. When the turn-off voltage Voff is applied to the selected drain and source selection lines Sel_DSL and Sel_SSL, the channels of the strings including the selected memory cells may be floated. In addition, the compensation voltage Vcom may be transferred to the selected word line Sel_WL and the unselected word lines Unsel_WL included in the i-th local lines LLi.

The channel maintenance operation CM is specifically described as follows. At a time point T4, the turn-off voltage Voff may be applied to the i-th block selection line BLKSELi to float the i-th local lines LLi (②). The turn-off voltage Voff may be the ground voltage GND. When the turn-off voltage Voff is applied to the i-th block selection line BLKSELi, since all pass switches PS1 to PSn+2 of FIG. 6 connected between the global lines GL and the i-th local lines LLi are turned off, connection between the global lines GL and the i-th local lines LLi may be blocked. Accordingly, the selected drain and source selection lines Sel_DSL and Sel_SSL may be floated in a state in which the turn-off voltage Voff is applied, and the selected word line Sel_WL and the unselected word lines Unsel_WL may be floated FLT in a state in which the compensation voltage Vcom is applied.

At a time point T5, a voltage of the global word lines Sel_GWL and Unsel_GWL may be adjusted to be low. For example, at the time point T5, a voltage applied to the global word lines Sel_GWL and Unsel_GWL may be lowered to have a level lower than a voltage applied to the global word lines Sel_GWL and Unsel_GWL when the channel initialization operation CI is performed. For example, at the time point T5, the voltage of the global word lines Sel_GWL and Unsel_GWL may be lowered to the ground voltage GND or lowered to a positive voltage Vpos higher than the ground voltage GND and lower than the verify voltage Vvf. At this time, since all of the pass switches PS1 to PSn+2 of FIG. 6 are turned off, the word lines Sel_WL and Unsel_WL included in the i-th local lines LLi may be maintained in the floating FLT state. Therefore, in the memory block to which the word lines Sel_WL and Unsel_WL included in the i-th local lines LLi are connected, a phenomenon in which a voltage of the channels of the strings is lower than the reference level may be prevented. That is, when the voltage of the channels of the strings is lower than the reference level, reliability of data of the memory cells may decrease when the read operation to be performed next is performed. Therefore, in an embodiment, the voltage of the channels might not be lowered lower than the reference level to improve reliability of the memory device. Thus, it is preferable to lower the voltage applied to the global word lines Sel_GWL and Unsel_GWL to the positive voltage Vpos higher than the ground voltage GND at the time point T5. Because leakage may occur in the pass switches PS1 to PSn+2 of FIG. 6. In order to effectively prevent the voltage of the word lines Sel_WL and Unsel_WL included in the i-th local lines LLi from being lowered, the logic circuit 170 of FIG. 1 may control the voltage generator 120 of FIG. 1 so that the positive voltage Vpos is applied to the global word lines Sel_GWL and Unsel_GWL.

Figure 9:
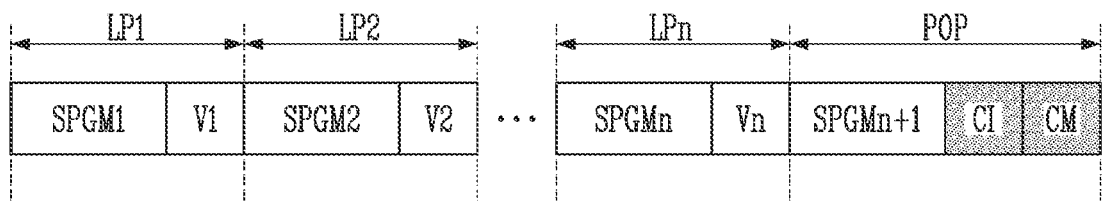
FIGS. 9 and 10 are diagrams for describing an operation method according to a second embodiment of the present disclosure.
Figure 10:
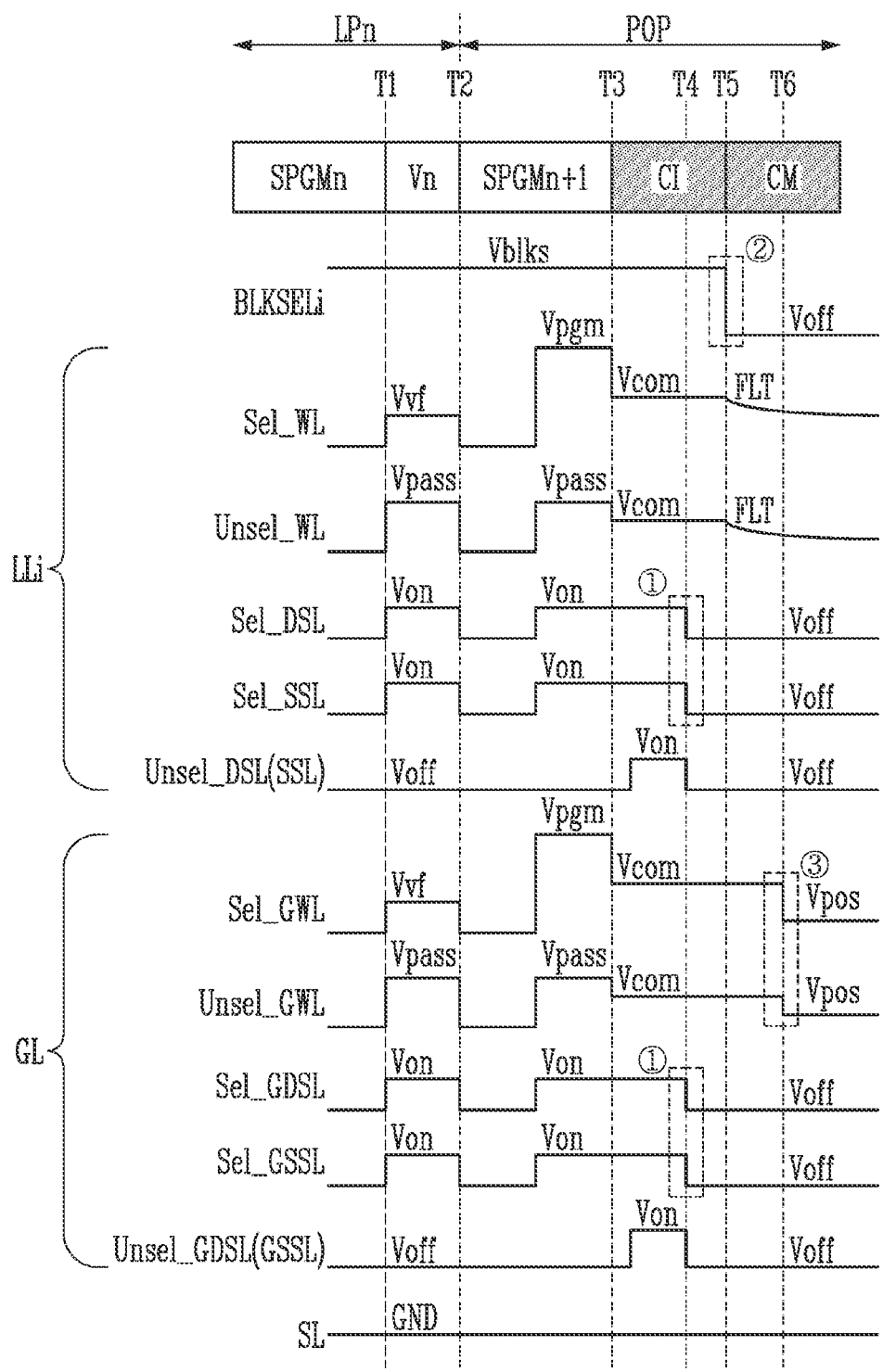

FIGS. 9 and 10 are diagrams for describing an operation method according to a second embodiment of the present disclosure.

FIG. 9 is a diagram for briefly describing the operation method according to the second embodiments, and FIG. 10 is a diagram for specifically describing the operation method according to the second embodiments.

Referring to FIG. 9, the program operation of the selected memory cells may be performed identically to the method described with reference to FIG. 7, and in the post operation POP, an (n+1)-th sub program operation SPGMn+1 may be additionally performed. For example, when the n-th verify operation Vn performed in the n-th loop LPn is passed, the channel initialization operation CI and the channel maintenance operation CM may be performed after the (n+1)-th sub program operation SPGMn+1 is performed. The (n+1)-th sub program operation SPGMn+1 may be performed to narrow a distribution width of the threshold voltage of the memory cells by additionally applying the program voltage to the selected word line Sel_WL after the program operation of the selected page is completed.

Referring to FIG. 10, in a period T1 to T2, the n-th verify operation Vn of the n-th loop LPn may be performed. When the n-th verify operation Vn is passed, the post operation POP may be performed from the time point T2.

While the program operation is performed, the block selection voltage Vblks having a positive voltage may be applied to the i-th block selection line BLKSELi. Therefore, the voltages applied to the global lines GL may be transferred to the i-th local lines LLi. For example, at the time point T1, when the verify voltage Vvf is applied to the global selected word line Sel_GWL, the verify voltage Vvf may be transferred to the selected word line Sel_WL, and when the pass voltage Vpass is applied to the global unselected word lines Unsel_GWL, the pass voltage Vpass may be transferred to the unselected word lines Unsel_WL. When the turn-on voltage Von is applied to the selected global drain selection line Sel_GDSL and the selected global source selection line Sel_GSSL, the turn-on voltage Von may be transferred to the selected drain selection line Sel_DSL and the selected source selection line Sel_SSL.

The turn-off voltage Voff may be applied to the unselected global drain and source selection lines Unsel_GDSL and Unsel_GSSL, and thus, the turn-off voltage Voff may also be applied to the unselected drain and source selection lines Unsel_DSL and Unsel_SSL. The ground voltage GND may be applied to the source line SL.

At the time point T2, when the n-th verify operation Vn is passed, since the program operation of the selected page is completed, the post operation POP may be performed from the time point T2. In the second embodiment shown in FIG. 10, the post operation POP may include the (n+1)-th sub program operation SPGMn+1 and the channel initialization operation CI.

At the time point T2, both of the global lines GL and the i-th local lines LLi may be discharged, and then the program voltage Vpgm may be applied to the selected global word line Sel_GWL. The program voltage Vpgm may have the same level as the program voltage used in the n-th sub program operation SPGMn, or may have a level lower than the program voltage used in the n-th sub program operation SPGMn. When the program voltage Vpgm is applied to the selected global word line Sel_GWL, the pass voltage Vpass may be applied to the unselected global word lines Unsel_GWL, and the turn-on voltage Von may be applied to the selected global drain and source selection lines Sel_GDSL and Sel_GSSL. At this time, the turn-off voltage Voff may be applied to the unselected global drain and source selection lines Unsel_GDSL and Unsel_GSSL.

Since the block selection voltage Vblks is applied to the i-th block selection line BLKSELi, the voltages applied to the global lines GL may be transferred to the i-th local lines LLi. After the program voltage Vpgm is applied to the selected word line Sel_WL during a predetermined time, the channel initialization operation CI may be performed.

The channel initialization operation CI may include applying the turn-on voltage Von to the global selection lines Sel_GDSL, Sel_GSSL, Unsel_GDSL, and Unsel_GSSL (T2 to T3), applying the turn-off voltage Voff to the selection lines Sel_GDSL, Sel_GSSL, Unsel_GDSL, and Unsel_GSSL (①), floating the local lines (②), and discharging the global word lines (③). Steps ①, ② and ③ may be sequentially performed.

The channel initialization operation CI is specifically described as follows.

At a time point T3, the compensation voltage Vcom lower than the program voltage Vpgm may be applied to the selected global word line Sel_GWL. The compensation voltage Vcom may have a level lower than the pass voltage Vpass and higher than the ground voltage GND. Accordingly, voltages having the same level as each other may be applied to the selected word line Sel_WL and the unselected word lines Unsel_WL.

After the compensation voltage Vcom is applied to the selected word line Sel_WL during a predetermined time, the turn-on voltage Von may be applied to the unselected global drain and source selection lines Unsel_GDSL and Unsel_GSSL. That is, since the turn-on voltage Von is applied to the unselected global drain and source selection lines Unsel_GDSL and Unsel_SSL and the selected global drain and source selection lines Sel_GDSL and Sel_GSSL, the turn-on voltage Von may also be transferred to the unselected drain and source selection lines Unsel_DSL and Sel_SSL and the selected drain and source selection lines Sel_DSL and Sel_SSL. Accordingly, channels of all strings included in the i-th memory block BLKi may be initialized.

At a time point T4, the turn-off voltage Voff may be continuously applied to the selected global drain and source selection lines Sel_GSSL and Sel_GSSL and the unselected global drain and source selection lines Unsel_GDSL and Unsel_GSSL (①). In addition, at the time point T4, the compensation voltage Vcom having a positive voltage level may be applied to the global word lines Sel_GWL and Unsel_GWL. The compensation voltage Vcom may have a level higher than the verify voltage Vvf and lower than the pass voltage Vpass. Since the block selection voltage Vblks is applied to the i-th block selection line BLKSELi in a period T4 to T5, the turn-off voltage Voff may be transferred to the selected drain and source selection lines Sel_DSL and Sel_SSL included in the i-th local lines LLi. When the turn-off voltage Voff is applied to the selected drain and source selection lines Sel_DSL and Sel_SSL, the channels of the strings including the selected memory cells may be floated. In addition, the compensation voltage Vcom may be transferred to the selected word line Sel_WL and the unselected word lines Unsel_WL included in the i-th local lines LLi.

The channel maintenance operation CM is specifically described as follows.

At the time point T5, the turn-off voltage Voff may be applied to the i-th block selection line BLKSELi to float the i-th local lines LLi (②). The turn-off voltage Voff may be the ground voltage GND. When the turn-off voltage Voff is applied to the i-th block selection line BLKSELi, since all pass switches PS1 to PSn+2 of FIG. 6 connected between the global lines GL and the i-th local lines LLi are turned off, connection between the global lines GL and the i-th local lines LLi may be blocked. Accordingly, the selected drain and source selection lines Sel_DSL and Sel_SSL may be floated in a state in which the turn-off voltage Voff is applied, and the selected word line Sel_WL and the unselected word lines Unsel_WL may be floated FLT in a state in which the compensation voltage Vcom is applied.

At a time point T6, the voltage of the global word lines Sel_GWL and Unsel_GWL may be adjusted to be low. For example, at the time point T6, the voltage applied to the global word lines Sel_GWL and Unsel_GWL may be lowered to have a level lower than the voltage applied to the global word lines Sel_GWL and Unsel_GWL when the channel initialization operation CI is performed. For example, at the time point T6, the voltage of the global word lines Sel_GWL and Unsel_GWL may be lowered to the ground voltage GND or lowered to the positive voltage Vpos higher than the ground voltage GND and lower than the verify voltage Vvf. At this time, since all of the pass switches PS1 to PSn+2 of FIG. 6 are turned off, the word lines Sel_WL and Unsel_WL included in the i-th local lines LLi may be maintained in the floating FLT state. Therefore, in the memory block to which the word lines Sel_WL and Unsel_WL included in the i-th local lines LLi are connected, a phenomenon in which the voltage of the channels of the strings is lower than the reference level may be prevented. That is, when the voltage of the channels of the strings is lower than the reference level, reliability of data of the memory cells may decrease when the read operation to be performed next is performed. Therefore, in the present embodiments, the voltage of the channels might not be lowered lower than the reference level to improve reliability of the memory device. Thus, it is preferable to lower the voltage applied to the global word lines Sel_GWL and Unsel_GWL to the positive voltage Vpos higher than the ground voltage GND at the time point T6. Because leakage may occur in the pass switches PS1 to PSn+2 of FIG. 6. In order to effectively prevent the voltage of the word lines Sel_WL and Unsel_WL included in the i-th local lines LLi from being lowered, the logic circuit 170 of FIG. 1 may control the voltage generator 120 of FIG. 1 so that the positive voltage Vpos is applied to the global word lines Sel_GWL and Unsel_GWL.

Figure 11:
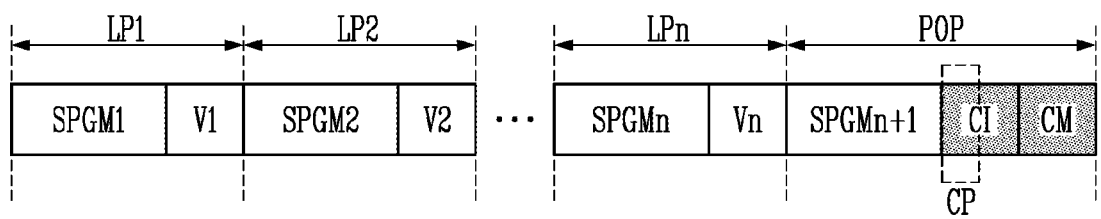
FIGS. 11 and 12 are diagrams for describing an operation method according to a third embodiment of the present disclosure.
Figure 12:
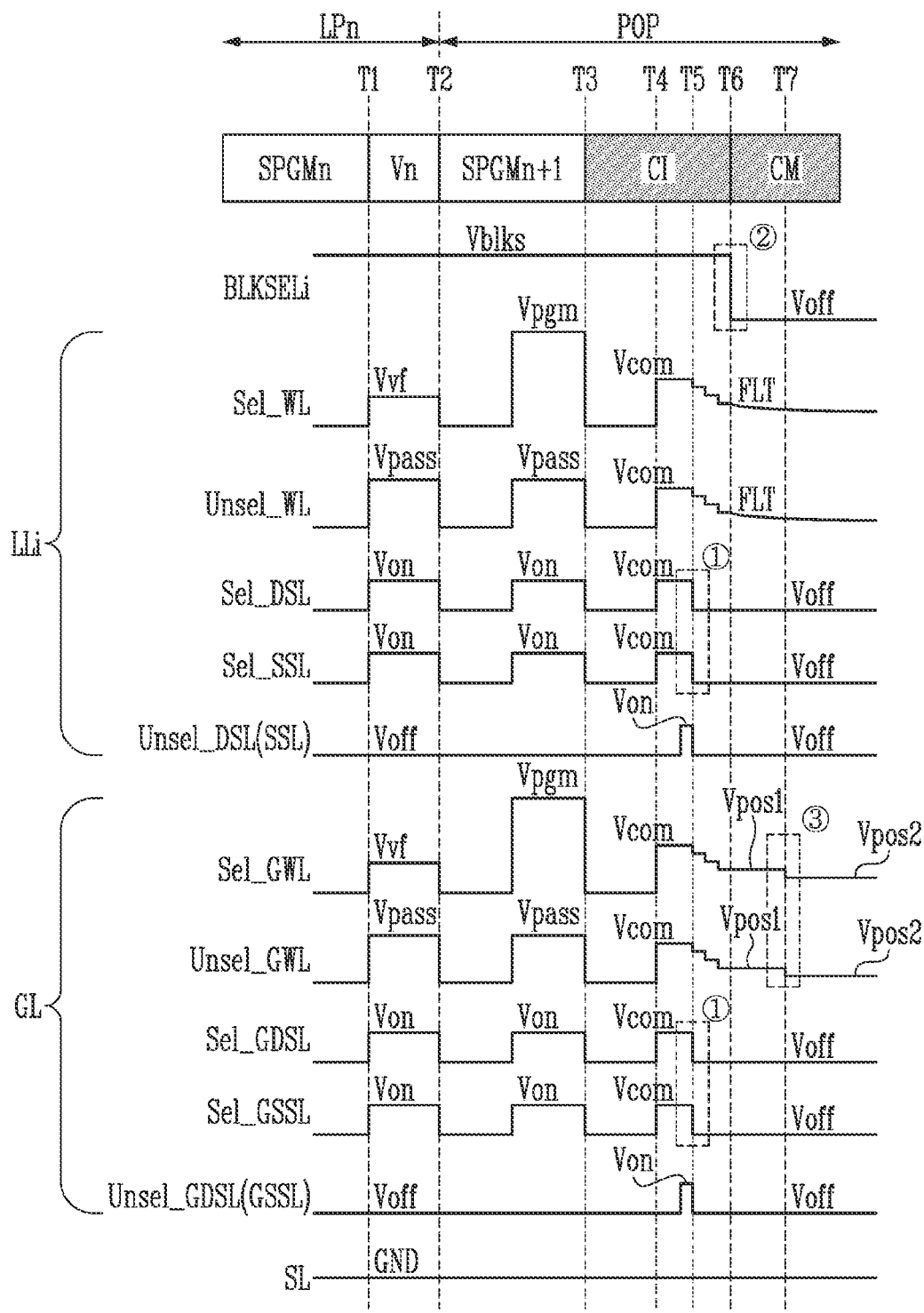

FIGS. 11 and 12 are diagrams for describing an operation method according to a third embodiment of the present disclosure.

FIG. 11 is a diagram for briefly describing the operation method according to the third embodiments, and FIG. 12 is a diagram for specifically describing the operation method according to the third embodiments.

Referring to FIG. 11, the program operation of the selected memory cells may be performed identically to the method described with reference to FIG. 7, and in the post operation POP, the (n+1)-th sub program operation SPGMn+1 and a channel compensation operation CP may be additionally performed. For example, when the n-th verify operation Vn performed in the n-th loop LPn is passed, the (n+1)-th sub program operation SPGMn+1, the channel initialization operation CI, and the channel maintenance operation CM may be sequentially performed. The (n+1)-th sub program operation SPGMn+1 may be performed to narrow the distribution width of the threshold voltage of the memory cells by additionally applying the program voltage to the selected word line Sel_WL after the program operation of the selected page is completed. The channel initialization operation CI and the channel maintenance operation CM may be performed to prevent the phenomenon in which the voltage of the channels is lower than the reference level due to coupling according to the voltage drop of the word lines when the word lines to which the positive voltage is applied are discharged in the program operation. In the third embodiment shown in FIG. 11, differently from the channel initialization operation CI shown in FIG. 9, an operation of discharging lines and sequentially reducing the voltage applied to the word lines may be included.

Referring to FIG. 12, in a period T1 to T2, the n-th verify operation Vn of the n-th loop LPn may be performed. When the n-th verify operation Vn is passed, the post operation POP may be performed from the time point T2.

While the program operation is performed, the block selection voltage Vblks having a positive voltage may be applied to the i-th block selection line BLKSELi. Therefore, the voltages applied to the global lines GL may be transferred to the i-th local lines LLi. For example, at the time point T1, when the verify voltage Vvf is applied to the global selected word line Sel_GWL, the verify voltage Vvf may be transferred to the selected word line Sel_WL, and when the pass voltage Vpass is applied to the global unselected word lines Unsel_GWL, the pass voltage Vpass may be transferred to the unselected word lines Unsel_WL. When the turn-on voltage Von is applied to the selected global drain selection line Sel_GDSL and the selected global source selection line Sel_GSSL, the turn-on voltage Von may be transferred to the selected drain selection line Sel_DSL and the selected source selection line Sel_SSL.

The turn-off voltage Voff may be applied to the unselected global drain and source selection lines Unsel_GDSL and Unsel_GSSL, and thus, the turn-off voltage Voff may also be applied to the unselected drain and source selection lines Unsel_DSL and Unsel_SSL. The ground voltage GND may be applied to the source line SL.

At the time point T2, when the n-th verify operation Vn is passed, since the program operation of the selected page is completed, the post operation POP may be performed from the time point T2. In the third embodiment shown in FIG. 12, the post operation POP may include the (n+1)-th sub program operation SPGMn+1, the channel initialization operation CI, and the channel maintenance operation CM.

At the time point T2, both of the global lines GL and the i-th local lines LLi may be discharged, and then the program voltage Vpgm may be applied to the selected global word line Sel_GWL. The program voltage Vpgm may have the same level as the program voltage used in the n-th sub program operation SPGMn, or may have a level lower than the program voltage used in the n-th sub program operation SPGMn. When the program voltage Vpgm is applied to the selected global word line Sel_GWL, the pass voltage Vpass may be applied to the unselected global word lines Unsel_GWL, and the turn-on voltage Von may be applied to the selected global drain and source selection lines Sel_GDSL and Sel_GSSL. At this time, the turn-off voltage Voff may be applied to the unselected global drain and source selection lines Unsel_GDSL and Unsel_GSSL.

Since the block selection voltage Vblks is applied to the i-th block selection line BLKSELi, the voltages applied to the global lines GL may be transferred to the i-th local lines LLi. After the program voltage Vpgm is applied to the selected word line Sel_WL during a predetermined time, the channel compensation operation CP may be performed in the period T3 to T5.

At the time point T3, after both of the global lines GL and the i-th local lines LLi are discharged, the compensation voltage Vcom may be applied to the global word lines Sel_GWL and Unsel_GWL and the global drain and source selection lines Sel_GDSL and Sel_GSSL at the time point T4. The compensation voltage Vcom may be set to a voltage lower than the pass voltage Vpass and higher than the verify voltage Vvf. Since the block selection voltage Vblks is applied to the i-th block selection line BLKSELi, the compensation voltage Vcom may be transferred to the selected word line Sel_WL, the unselected word lines Unsel_WL, and the selected drain and source selection lines Sel_DSL and Sel_SSL. Before the time point T5 starts, the turn-on voltage Von may be applied to the unselected global drain and source selection lines Unsel_GDSL and Unsel_GSSL. That is, since the turn-on voltage Von is applied to the unselected global drain and source selection lines Unsel_GDSL and Unsel_GSSL and the selected global drain and source selection lines Sel_GDSL and Sel_GSSL, the turn-on voltage Von may also be transferred to the unselected drain and source selection lines Unsel_DSL and Sel_SSL and the selected drain and source selection lines Sel_DSL and Sel_SSL. Accordingly, channels of all strings included in the i-th memory block BLKi may be initialized.

At the time point T5, the turn-off voltage Voff may be applied to the global drain and source selection lines Sel_GDSL and Sel_GSSL (①). Since the block selection voltage Vblks is applied to the i-th block selection line BLKSELi, the turn-off voltage Voff may be transferred to the selected drain and source selection lines Sel_DSL and Sel_SSL included in the i-th local lines LLi. When the turn-off voltage Voff is applied to the selected drain and source selection lines Sel_DSL and Sel_SSL, the channels of the strings including the selected memory cells may be floated.

In a period T5 to T6, the voltage of the global word lines Sel_GWL and Unsel_GWL may be lowered stepwise. For example, when the compensation voltage Vcom is applied to the global word lines Sel_GWL and Unsel_GWL until the time point T5, voltages lower than the compensation voltage Vcom may be applied to the global word lines Sel_GWL and Unsel_GWL stepwise in the period T5 to T6. When the voltage applied to the global word lines Sel_GWL and Unsel_GWL is lowered stepwise, voltages that are lowered stepwise may be sequentially applied to the selected word line Sel_WL and the unselected word lines Unsel_WL included in the i-th local lines LLi. In the period T5 to T6, the voltage of the global word lines Sel_GWL and Unsel_GWL may be lowered to a first positive voltage Vpos1 having a level higher than the ground voltage GND.

The channel maintenance operation CM is specifically described as follows.

At the time point T6, the turn-off voltage Voff may be applied to the i-th block selection line BLKSELi to float the i-th local lines LLi (②). The turn-off voltage Voff may be the ground voltage GND. When the turn-off voltage Voff is applied to the i-th block selection line BLKSELi, since all pass switches PS1 to PSn+2 of FIG. 6 connected between the global lines GL and the i-th local lines LLi are turned off, connection between the global lines GL and the i-th local lines LLi may be blocked. Accordingly, the selected drain and source selection lines Sel_DSL and Sel_SSL may be floated in a state in which the turn-off voltage Voff is applied, and the selected word line Sel_WL and the unselected word lines Unsel_WL may be floated FLT in a state in which the first positive voltage Vpos1 is applied.

At a time point T7, the global word lines Sel_GWL and Unsel_GWL may be lowered from the first positive voltage Vpos1 to a second positive voltage Vpos2 (③). The second positive voltage Vpos2 may be set to a level between the first positive voltage Vpos1 and the ground voltage GND. For example, at the time point T7, the voltage of the global word lines Sel_GWL and Unsel_GWL may be lowered to the ground voltage GND or lowered to the second positive voltage Vpos2 higher than the ground voltage GND and lower than the first positive voltage Vpos1. At this time, since all of the pass switches PS1 to PSn+2 of FIG. 6 are turned off, the word lines Sel_WL and Unsel_WL included in the i-th local lines LLi may be maintained in the floating FLT state. Therefore, in the memory block to which the word lines Sel_WL and Unsel_WL included in the i-th local lines LLi are connected, a phenomenon in which the voltage of the channels of the strings is lower than the reference level may be prevented. That is, when the voltage of the channels of the strings is lower than the reference level, reliability of data of the memory cells may decrease when the read operation to be performed next is performed. Therefore, in the present embodiment, the voltage of the channels might not be lowered lower than the reference level to improve reliability of the memory device. Thus, it is preferable to lower the voltage applied to the global word lines Sel_GWL and Unsel_GWL to the second positive voltage Vpos2 higher than the ground voltage GND at the time point T7. Because leakage may occur in the pass switches PS1 to PSn+2 of FIG. 6. In order to effectively prevent the voltage of the word lines Sel_WL and Unsel_WL included in the i-th local lines LLi from being lowered, the logic circuit 170 of FIG. 1 may control the voltage generator 120 of FIG. 1 so that the second positive voltage Vpos2 is applied to the global word lines Sel_GWL and Unsel_GWL. Therefore, in the memory block to which the word lines Sel_WL and Unsel_WL included in the i-th local lines LLi are connected, a phenomenon in which the voltage of the channels of the strings is lower than the reference level may be prevented. That is, when the voltage of the channels of the strings is lower than the reference level, reliability of data of the memory cells may decrease when the read operation to be performed next is performed. Therefore, in the present embodiments, the voltage of the channels might not be lowered lower than the reference level to improve reliability of the memory device.

Figure 13:
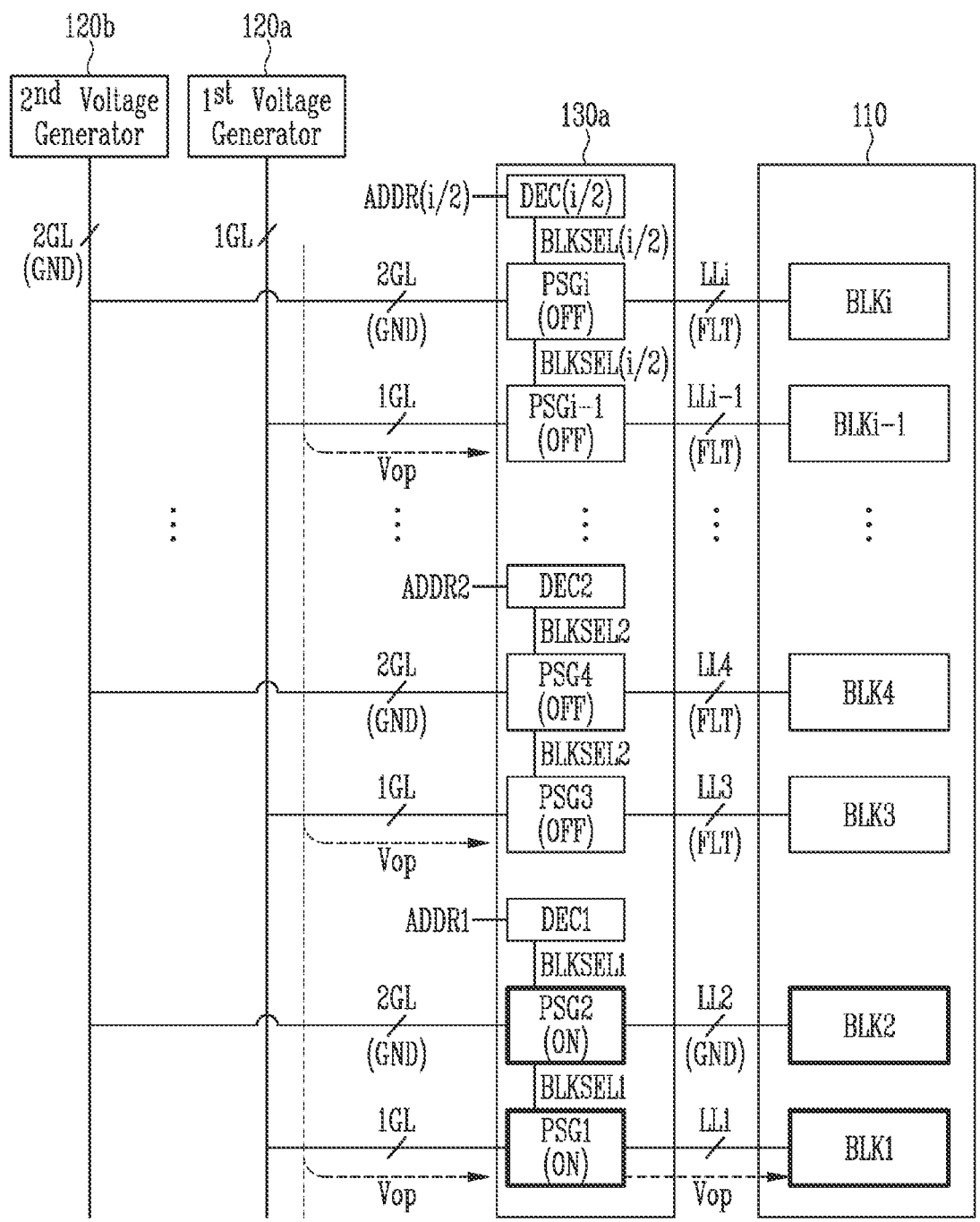
FIG. 13 is a diagram for specifically describing a row decoder according to another embodiment of the present disclosure.

FIG. 13 is a diagram for specifically describing a row decoder according to another embodiment of the present disclosure.

Referring to FIG. 13, the row decoder 130a may include a plurality of decoders DEC1 to DEC(i/2) and a plurality of pass switch groups PSG1 to PSGi, one decoder may be configured to simultaneously turn on or turn off two or more pass switches groups. To this end, a plurality of voltage generators may also be included. The number of included voltage generators may be the same as the number of pass switch groups operated by one decoder. For example, when the first and second pass switch groups PSG1 and PSG2 are commonly connected to the first decoder DEC1, since one decoder controls the two pass switch groups, the voltage generator may include a first voltage generator 120a and a second voltage generator 120b configured to output voltage to the respective first and second pass switch groups PSG1 and PSG2. That is, the first and second pass switch groups PSG1 and PSG2 may be commonly connected to the first block selection line BLKSEL1, and the first decoder DEC1 may output the block selection voltage to the first block selection line BLKSEL1 in response to the first row address ADDR1. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

The first voltage generator 120a may be connected to the first pass switch group PSG1 through first global lines 1GL, and the second voltage generator 120b may be connected to the second pass switch group PSG2 through second global lines 2GL. When one of the first and second voltage generators 120a and 120b is activated, the other may be deactivated.

A case where the first memory block BLK1 is selected is described as an example.

The first voltage generator 120a may output the operation voltages Vop through the first global lines 1GL, and the second voltage generator 120b may output the ground voltage GND through the second global lines 2GL. The operation voltages Vop are applied to odd-numbered pass switch groups PSG1, PSG3, . . . , and PSGi-1 connected to the first global lines 1GL. When the first decoder DEC1 outputs the block selection voltage to the first block selection line BLKSEL1 in response to the first row address ADDR1, the pass switches included in the first and second pass switch groups PSG1 and PSG2 may be turned on. In response to second to (i/2)-th row addresses ADDR2 to ADDR(i/2), all of the remaining even-numbered pass switch groups PSG2, PSG4, . . . , and PSGi are deactivated, all of the pass switches included in the even-numbered pass switch groups PSG2, PSG4 . . . , and PSGi may be turned off. Therefore, the operation voltages Vop may be transferred only to the first local lines LL1, the ground voltage GND may be applied to the second local lines LL2, and the remaining third to i-th local lines LL3 to LLi may be floated FLT.

Figure 14:
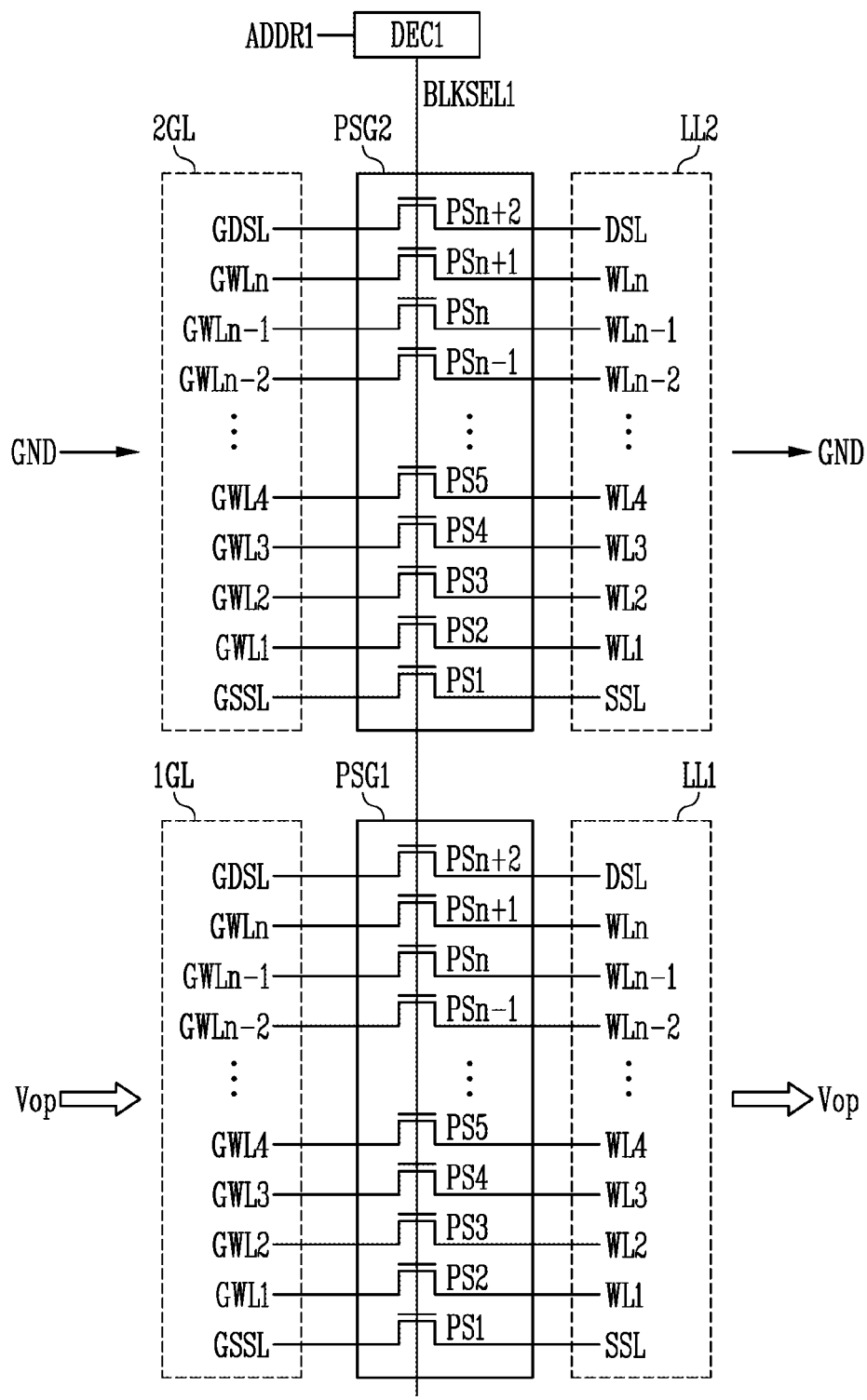
FIG. 14 is a diagram for specifically describing a pass switch group shown in FIG. 13.

FIG. 14 is a diagram for specifically describing the pass switch group shown in FIG. 13.

Referring to FIG. 14, all gates of the pass switches PS1 to PSn+2 included in each of the first and second pass switch groups PSG1 and PSG2 may be commonly connected to the first block selection line BLKSEL1.

The first to (n+2)-th pass switches PS1 to PSn+2 included in the first pass switch group PSG1 may be connected between the first global lines 1GL and the first local lines LL1. For example, the first pass switch PS1 included in the first pass switch group PSG1 may be connected between the global source selection line GSSL included in the first global lines 1GL and a source selection line SSL included in the first local lines LL1. In such a method, the second to (n+1)-th pass switches PS2 to PSn+1 may be connected between the first to n-th global word lines GWL1 to GWLn and the first to n-th word lines WL1 to WLn, and the (n+2)-th pass switch PSn+2 may be connected between the global drain selection line GDSL and the drain selection line DSL. The first pass switch PS1 included in the second pass switch group PSG2 may be connected between the global source selection line GSSL included in the second global lines 2GL and the source selection line SSL included in the second local lines LL2. In such a method, the second to (n+1)-th pass switches PS2 to PSn+1 may be connected between the first to n-th global word lines GWL1 to GWLn and the first to n-th word lines WL1 to WLn, and the (n+2)-th pass switch PSn+2 may be connected between the global drain selection line GDSL and the drain selection line DSL.

When the positive block selection voltage is applied to the first block selection line BLKSEL1, since the first to (n+2)-th pass switches PS1 to PSn+2 included in the first and second pass switch groups PSG1 and PSG2 are simultaneously turned on, the second local lines LL2 may be connected to the second global lines 2GL, and the first local lines LL1 may be connected to the first global lines 1GL. Since the ground voltage GND is applied to the second global lines 2GL, the ground voltage GND may be transferred to the second local lines LL2. Since the operation voltages Vop are applied to the first global lines 1GL, the operation voltages Vop may be transferred to the first local lines LL1.

In the device shown in FIGS. 13 and 14, the program operation and the post operation may be performed according to the embodiments shown in FIGS. 7 to 12 described above.

Figure 15:
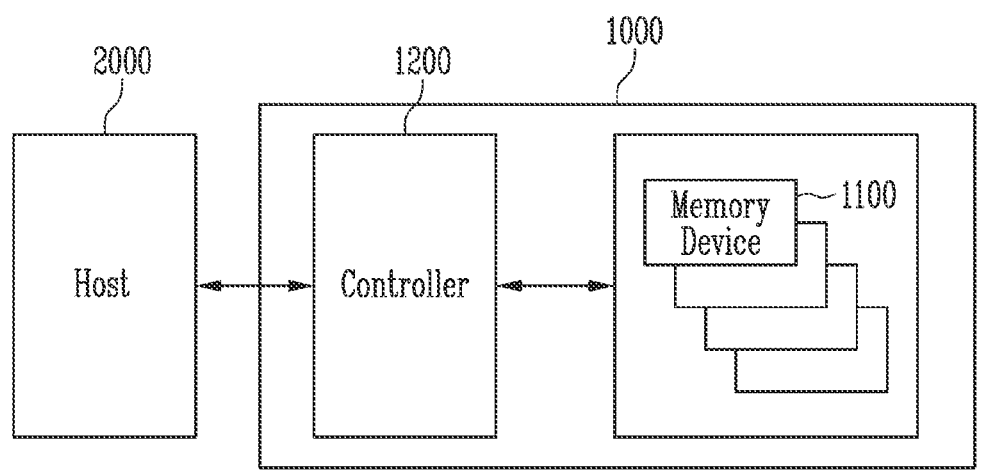
FIG. 15 is a diagram for describing a memory system including the memory device of the present disclosure.

FIG. 15 is a diagram for describing a memory system including the memory device of the present disclosure.

Referring to FIG. 15, the memory system 1000 may include the memory device 1100 in which data is stored, and the controller 1200 communicating between the memory device 1100 and a host 2000.

The memory system 1000 may include a plurality of memory devices 1100, and each of the memory devices 1100 may perform the program operation according to the embodiments described above. The memory devices 1100 may be connected to the controller 1200 through at least one channel. For example, a plurality of memory devices 1100 may be connected to one channel, and the plurality of memory devices 1100 may be connected to each channel even in a case where a plurality of channels are connected to the controller 1200.

The controller 1200 may communicate between the host 2000 and the memory device 1100. The controller 1200 may control the memory device 1100 according to a request of the host 2000 or may perform a background operation for performance improvement of the memory system 1000 even though there is no request from the host 2000. The host 2000 may generate requests for various operations and output the generated requests to the memory system 1000. For example, the requests may include a program request that may control a program operation, a read request that may control a read operation, an erase request that may control an erase operation, and the like.

The host 2000 may communicate with the memory system 1000 through various interfaces such as peripheral component interconnect express (PCIe), advanced technology attachment (ATA), serial ATA (SATA), parallel ATA (PATA), serial attached SCSI (SAS), non-volatile memory express (NVMe) a universal serial bus (USB), a multi-media card (MMC), an enhanced small disk interface (ESDI), or integrated drive electronics (IDE).

Figure 16:
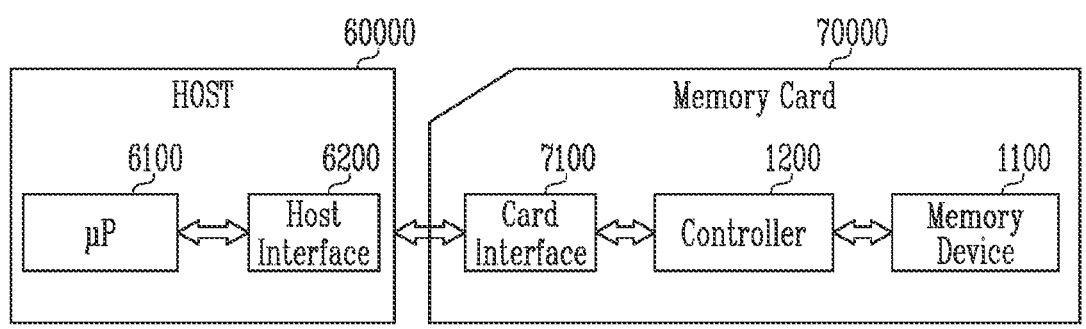
FIG. 16 is a diagram for describing another memory system including the memory device of the present disclosure.

FIG. 16 is a diagram for describing another memory system including the memory device of the present disclosure.

Referring to FIG. 16, the memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto.

The memory device 1100 may perform the program operation according to the above-described embodiments, and data programmed in the memory device 1100 may be output through the card interface 7100 under the control of the controller 1200 during the read operation.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the controller 1200 under control of a microprocessor (μP) 6100.

What is claimed is:

1. A memory device comprising:
a memory block including a plurality of strings including a plurality of memory cells connected to local lines;
a voltage generator configured to generate operation voltages and output the operation voltages to global lines;
a pass switch group connecting or blocking the global lines and the local lines to each other or from each other in response to a block selection voltage;
a decoder configured to output the block selection voltage in response to a row address; and
a logic circuit configured to control the decoder and the voltage generator so that the local lines are floated after channels of the strings are initialized, a voltage of the global lines is lower than a voltage of the global lines when the channels of the strings are initialized, and the channels of the strings are initialized and the local lines are floated when a program operation of selected memory cells included in a selected page of the memory block is completed.

2. The memory device of claim 1, wherein the voltage generator is configured to output at least one of a program voltage, a verify voltage, a pass voltage, a compensation voltage, a turn-on voltage, a turn-off voltage, and a ground voltage through the global lines.

3. The memory device of claim 2, wherein the program voltage, the verify voltage, and the pass voltage are set to be higher than the ground voltage,
the pass voltage is set to be higher than the verify voltage,
the program voltage is set to be higher than the pass voltage, and
the compensation voltage is set to be higher than the verify voltage and lower than the pass voltage.

4. The memory device of claim 1, wherein the pass switch group includes a plurality of switches connected between the global lines and the local lines, and simultaneously turned on or turned off according to the block selection voltage.

5. The memory device of claim 2, wherein when the program operation of the selected memory cells included in the selected page is completed, the logic circuit controls the voltage generator to float the channels by applying the turn-off voltage to global word lines included in the global lines after initializing the channels by applying the turn-on voltage to global drain and source selection lines included in the global lines, controls the decoder to float the local lines by blocking the global lines and the local lines from each other, and controls the voltage generator so that a low voltage is applied to the global word lines included in the global lines in a state in which the local lines are floated.

6. The memory device of claim 5, wherein the logic circuit controls the voltage generator so that the compensation voltage is applied to the global word lines after the channels are floated.

7. The memory device of claim 5, wherein the low voltage applied to the global word lines is a positive voltage higher than the ground voltage.

8. A method of operating a memory device, the method comprising:
    providing a voltage generator outputting operation voltages through global lines, pass switches transferring the operation voltages applied to the global lines to local lines, and a memory block including a plurality of memory cells connected to the local lines;
    connecting the global lines and the local lines to each other;
    performing a program operation of selected memory cells connected to a selected word line among the local lines;
    initializing channels of strings including the memory cells when the program operation is completed;
    floating the channels after the channels are initialized;
    blocking the global lines and the local lines from each other when the channels are floated; and
    decreasing a voltage of global word lines included in the global lines when the local lines are floated.

9. The method of claim 8, wherein initializing the channels comprises applying a ground voltage to a source line which is coupled to the strings and applying a turn-on voltage to selection lines connected to selection transistors which are coupled between the strings and the source line, wherein the selection lines are disposed at ends of each of the strings and word lines are disposed between the selection lines.

10. The method of claim 9, wherein floating the channels comprises:
    applying a turn-off voltage to global selection lines included in the global lines in a state in which the global lines and the local lines are connected to each other;
    transferring the turn-off voltage applied to the global selection lines to the selection lines included in the local lines; and
    turning off the selection transistors connected to the selection lines according to the turn-off voltage transferred to the local lines.

11. The method of claim 8, wherein blocking the global lines and the local lines from each other comprises turning off the pass switches.

12. The method of claim 8, further comprising before floating the channels after the program operation is completed:
    discharging the local lines;
    applying a program voltage to the selected word line when the local lines are discharged, wherein the selected word line is one of the local lines;
    applying a pass voltage to unselected word lines among the local lines; and
    applying a turn-on voltage to selection lines among the local lines.

13. The method of claim 12, wherein discharging the local lines is performed by discharging the global lines in a state in which the global lines and the local lines are connected to each other.

14. The method of claim 12, wherein applying a program voltage to the selected word line comprises applying the program voltage to a selected global word line included in the global word lines.

15. The method of claim 12, wherein applying the pass voltage to the unselected word lines is performed by applying the pass voltage to unselected global word lines included in the global word lines.

16. The method of claim 12, wherein applying the turn-on voltage to the selection lines is performed by applying the turn-on voltage to global selection lines included in the global lines.

17. The method of claim 12, further comprising after applying the turn-on voltage to the selection lines:
    discharging the local lines; and
    applying a compensation voltage to the local lines.

18. The method of claim 17, wherein discharging the local lines is performed by discharging the global lines in a state in which the global lines and the local lines are connected to each other.

19. The method of claim 17, wherein applying the compensation voltage to the local lines is performed by applying the compensation voltage to the global lines in a state in which the global lines and the local lines are connected to each other.

20. The method of claim 17, wherein the compensation voltage is set to be lower than the pass voltage and higher than a ground voltage.

* * * * *